(12) United States Patent
Lee et al.

(10) Patent No.: US 12,125,553 B2
(45) Date of Patent: Oct. 22, 2024

(54) MEMORY DEVICE PERFORMING OFFSET CALIBRATION AND OPERATING METHOD THEREOF

(71) Applicant: Samsung Electronics Co., Ltd., Suwon-si (KR)

(72) Inventors: Donghun Lee, Suwon-si (KR); Kiho Kim, Suwon-si (KR); Kihan Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 183 days.

(21) Appl. No.: 17/968,052

(22) Filed: Oct. 18, 2022

(65) Prior Publication Data
US 2023/0129949 A1 Apr. 27, 2023

(30) Foreign Application Priority Data

Oct. 27, 2021 (KR) .......... 10-2021-0144975
Jun. 9, 2022 (KR) .......... 10-2022-0070295

(51) Int. Cl.
*G11C 7/10* (2006.01)

(52) U.S. Cl.
CPC .......... *G11C 7/1048* (2013.01); *G11C 7/1084* (2013.01); *G11C 2207/2254* (2013.01)

(58) Field of Classification Search
CPC ............... G11C 7/1048; G11C 7/1084; G11C 2207/2254
See application file for complete search history.

(56) References Cited

U.S. PATENT DOCUMENTS

| 8,102,203 | B2 | 1/2012 | Drost et al. |
| 8,659,456 | B2 | 2/2014 | Chang et al. |
| 8,867,595 | B1 | 10/2014 | Luo et al. |
| 9,355,693 | B2* | 5/2016 | Maeng ................. G11C 7/1084 |
| 9,389,637 | B2* | 7/2016 | Nguyen .................... G06F 1/12 |
| 9,621,337 | B2 | 4/2017 | Hao et al. |
| 9,748,956 | B2 | 8/2017 | Lee et al. |

(Continued)

OTHER PUBLICATIONS

Extended European Search Report issued Feb. 24, 2023 for corresponding EP Patent Application No. 22203223.7.

(Continued)

*Primary Examiner* — Son L Mai
(74) *Attorney, Agent, or Firm* — Muir Patent Law, PLLC (57) ABSTRACT

Disclosed are a memory device that performs offset calibration and a method of operating the memory device. The memory device includes an input/output pad configured to receive data from a device external, an on-die termination (ODT) circuit connected to the input/output pad, a plurality of receivers connected to the ODT circuit and configured to receive the data from the input/output pad, an offset calibration circuit configured to perform an offset calibration operation on data output from the plurality of receivers and output an offset correction, a first switch configured to provide a first voltage to the plurality of receivers, and a second switch configured to provide a second voltage to the plurality of receivers. During the offset calibration operation, the plurality of receivers receive a third voltage in response to the ODT circuit being enabled and the first voltage through the first switch.

20 Claims, 10 Drawing Sheets

(56) References Cited

U.S. PATENT DOCUMENTS

| | | | |
|---|---|---|---|
| 11,482,262 B1* | 10/2022 | Lee ..................... | G11C 7/1048 |
| 2004/0222834 A1 | 11/2004 | Frans et al. | |
| 2011/0249514 A1 | 10/2011 | Nguyen et al. | |
| 2013/0034139 A1 | 2/2013 | Khlat et al. | |
| 2018/0167055 A1 | 6/2018 | Gans | |
| 2019/0228832 A1 | 7/2019 | Heo et al. | |
| 2019/0259429 A1 | 8/2019 | Heo et al. | |

OTHER PUBLICATIONS

JEDEC Standard, Low Power Double Data Rate 5 (LPDDR5), JESD209-5B, Jun. 2021.

* cited by examiner

MEMORY DEVICE PERFORMING OFFSET CALIBRATION AND OPERATING METHOD THEREOF

CROSS-REFERENCE TO RELATED APPLICATION(S)

This application is based on and claims priority under 35 U.S.C. § 119 to Korean Patent Application Nos. 10-2021-0144975, filed on Oct. 27, 2021, and 10-2022-0070295, filed on Jun. 9, 2022, in the Korean Intellectual Property Office, the disclosure of each of which is incorporated by reference herein in its entirety.

BACKGROUND

The example embodiments of the inventive concept relate to a memory device, and more particularly, to a memory device for performing offset calibration and an operating method thereof.

As communication between a controller and a memory device includes a high-speed memory, such as dynamic random access memory (DRAM) or static random access memory (SRAM), the communication speed is increasing. As a high-speed signal passes through a channel, signal integrity (SI) characteristics may be deteriorated due to inter-symbol interference (ISI).

SUMMARY

The inventive concept provides a memory device that operates offset calibration and offset calibration feedback by selecting a voltage in order to improve signal integrity, and a method of operating the memory device.

According to an aspect of the inventive concept, there is provided a memory device, including an input/output pad configured to receive data from a device external, an on-die termination (ODT) circuit connected to the input/output pad, a plurality of receivers each including a first input terminal connected to the ODT circuit and configured to receive the data from the input/output pad as a first input data, a second input terminal configured to receive a second input data, and an output terminal configured to output data based on the first and second input data, an offset calibration circuit configured to perform an offset calibration operation on the data output from the plurality of receivers and output an offset correction as a result of the offset calibration operation to the plurality of receivers, a first switch configured to provide a first voltage to the second input terminals of the plurality of receivers in response to the first switch being turned on, and a second switch configured to provide a second voltage different from the first voltage to the second input terminals in response to the second switch being turned on. The plurality of receivers are configured to, during the offset calibration operation, receive a third voltage different from the second voltage through the first input terminals of the plurality of receivers in response to the ODT circuit being enabled, receive the first voltage through the second input terminals in response to the first switch being turned on and the second switch being turned off, and receive the offset correction as the result of the offset calibration operation from the ODT circuit.

According to another aspect of the inventive concept, there is provided a method of operating a memory device including a plurality of receivers each having a first input terminal connected to an on-die termination (ODT) circuit, a second input terminal, and an output terminal connected to an offset calibration circuit. The method includes enabling the ODT) circuit to provide a third voltage to the first input terminals of the plurality of receivers in response to the mode register write start command from a device external, turning off a second switch and turning on a first switch to provide a first voltage to the second input terminals of the plurality of receivers, outputting data from the output terminals of the plurality of receivers to the offset calibration circuit in response to voltage levels of the first and third voltages, performing an offset calibration operation on the data output from the plurality of receivers by the offset calibration circuit, feeding back a result of performing the offset calibration operation to the plurality of receivers, and turning off the first switch and turning on the second switch to provide a second voltage different from the first voltage to the second input terminals.

According to another aspect of the inventive concept, there is provided a method of operating a memory device including a plurality of receivers. The method includes enabling an ODT circuit connected to first input terminals of the plurality of receivers to provide a third voltage to the first input terminals in response to a mode register write start command from a device external, turning on a first switch to provide a first voltage the same as the third voltage to second input terminals of the plurality of receivers, outputting a data from output terminals of the plurality of receivers in response to voltage levels of the first and third voltages, performing an offset calibration operation on the data received from the plurality of receiver, feeding back a result of performing the offset calibration operation, and turning off the first switch and turning on a second switch to provide a second voltage different from the first voltage to the second input terminals.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1:
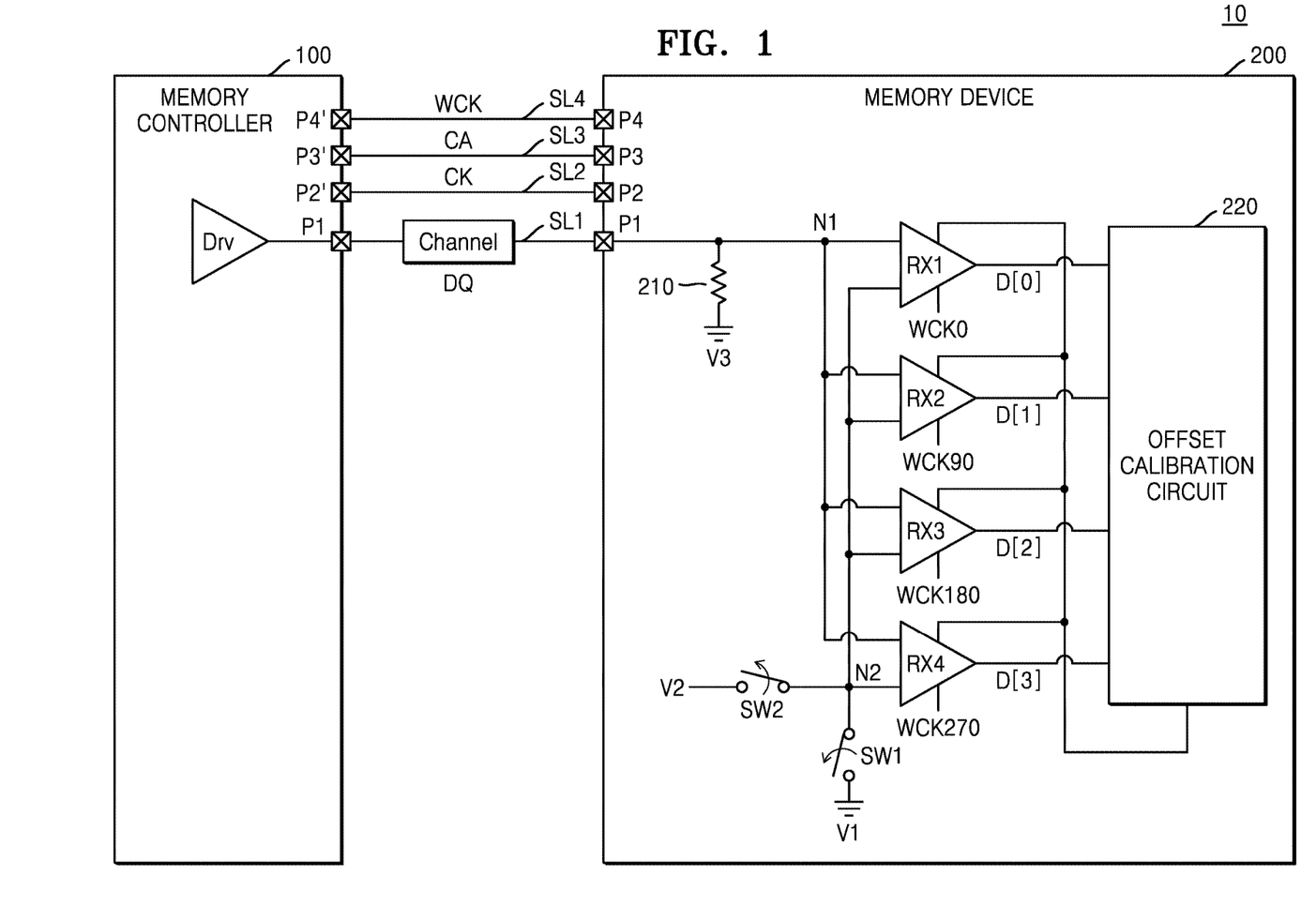
FIG. 1 is a block diagram illustrating a memory system according to an embodiment.

FIG. 1 is a block diagram illustrating a memory system according to an embodiment.

Referring to FIG. 1, a memory system 10 may include a memory controller 100 and a memory device 200, and the memory controller 100 may be connected to and the memory device 200 through a channel. For example, the memory controller 100 may be connected to the memory device 200 based on a memory interface protocol defined in a toggle standard. However, the inventive concept is not limited thereto, and the memory controller 100 may be connected to the memory device 200 based on various standard interfaces.

For example, the interface for connecting the memory controller 100 to the memory device 200 may be implemented using various interface methods, such as advanced technology attachment (ATA), serial ATA (SATA), external SATA (e-SATA), small computer small interface (SCSI), serial attached SCSI (SAS), peripheral component interconnection (PCI), PCI express (PCIe), NVM express (NVMe), IEEE 1394, universal serial bus (USB), secure digital (SD) card, multi-media card (MMC), embedded multi-media card (eMMC), universal flash storage (UFS), embedded universal flash storage (eUFS), compact flash (CF) card interface, and the like.

Referring back to FIG. 1, the memory system 10 may include a plurality of pins for transferring signals input/output between the memory controller 100 and the memory device 200. Here, a pin may mean a conductor and may be referred to as a terminal.

The memory device 200 may be connected to the memory controller 100 through first to fourth signal lines SL1 to SL4. The memory device 200 may include a plurality of input/output pins (or input/output pads) P1 to P4 respectively corresponding to the first to fourth signal lines SL1 to SL4. The plurality of input/output pins P1 to P4 included in the memory device 200 may respectively correspond to the plurality of input/output pins P1' to P4' included in the memory controller 100.

The memory controller 100 may be connected to the memory device 200 through the first signal line SL1. The memory device 200 may receive data DQ through the first pin P1. The first signal line SL1 may be referred to as a data signal line. The first pins P1 and P1' may be referred to as data input/output pins. A plurality of receivers (RX1 to RXn, n is a natural number) included in the memory device 200 may share the first signal line SL1. For example, when the number of receivers is 4, each of the plurality of receivers RX1 to RX4 may receive a plurality of data signals DQ[0:3] through the first signal line SL1. For example, when the number of receivers is 8, each of the plurality of receivers RX1 to RX8 may receive a plurality of data signals DQ[0:7] through the first signal line SL1.

The memory controller 100 may be connected to the memory device 200 through the second signal line SL2. The memory controller 100 may provide a clock signal CK to the memory device 200 through the second signal line SL2. The memory device 200 may receive the clock signal CK through the second pin P2. The second signal line SL2 may be referred to as a clock signal line. The second pins P2 and P2' may be referred to as clock input/output pins. The clock signal CK may be used for timing when the memory controller 100 provides commands and addresses to the memory device 200.

The memory controller 100 may be connected to the memory device 200 through the third signal line SL3. The memory controller 100 may provide an address/command CA to the memory device 200 through the third signal line SL3. The memory device 200 may receive the address/command CA through the third pin P3. The third signal line SL3 may be referred to as an address/command signal line. The third pins P3 and P3' may be referred to as address/command input/output pins.

The memory controller 100 may be connected to the memory device 200 through the fourth signal line SL4. The memory controller 100 may provide a data clock WCK to the memory device 200 through the fourth signal line SL4. The memory device 200 may receive the data clock WCK through the fourth pin P4. The fourth signal line SL4 may be referred to as a data clock signal line. The fourth pins P4 and P4' may be referred to as data clock input/output pins. The data clock WCK may be used for timing when the memory controller 100 provides data to the memory device 200.

The memory controller 100 may include a driver Drv. Signal integrity (SI) characteristics of the signal and/or data output from the driver Dry may be deteriorated due to inter symbol interference (ISI) while passing through the first signal line SL1. In order to improve the SI characteristics of the signal and/or data, the plurality of receivers (RX1 to RXn, n is a natural number) of the memory device 200 may compensate for the SI characteristics by performing offset calibration on a signal received through the first signal line SL1, a voltage connected to an on-die termination (ODT) circuit 210, and a voltage difference between a voltage level of first voltage V1 and a voltage level of second voltage V2.

The memory device 200 may include the plurality of receivers (RX1 to RXn, where n is a natural number), the ODT circuit 210, and an offset calibration circuit 220. The memory device 200 may include the ODT circuit 210 connected to a first connection node N1, and a first switch SW1 and a second switch SW2 connected to a second connection node N2. When the first switch SW1 is turned on, the plurality of receivers RX1 to RXn may receive the first voltage V1, and when the second switch is turned on, the plurality of receivers RX1 to RXn may receive the second voltage V2. The first voltage V1 may be a ground voltage, and the second voltage V2 may be a reference voltage. The reference voltage may be an average of voltage values provided from the memory controller 100 to the memory device 200.

The plurality of receivers RX1 to RXn (n is a natural number) may include first to fourth receivers RX1 to RX4. For example, each of the plurality of receivers RX1 to RXn may include first and second input terminals and an output terminal. In FIG. 1, it is assumed that there are four receivers. Each of the first to fourth receivers RX1 to RX4 may be connected to the first signal line SL1 through the first input terminals of the first to fourth receivers RX1 to RX4. The first input terminals of the first to fourth receivers RX1 to RX4 may receive the data DQ from the memory controller 100 through the first pin P1 connected to the first signal line SL1. The first to fourth receivers RX1 to RX4 may receive first to fourth data D[0:3] through the first connection node N1 connected to the first pin P1. The second input terminals of the first to fourth receivers RX1 to RX4 may receive the first voltage V1 through the first switch SW1 or the second voltage V2 through the second switch SW2 connected to the second connection node N2. Here, the reception of the first voltage V1 or the second voltage V2 may mean that the voltage level or the current level of the voltage (source) may be received.

The first receiver RX1 may receive a first data D[0] in a first phase (e.g., WCK0). The second receiver RX2 may receive a second data D[1] in a second phase (e.g., WCK90). The second phase may be a phase that is 90 degrees lagging the first phase. The third receiver RX3 may receive a third data D[2] in a third phase (e.g., WCK180). The third phase may be a phase that is 90 degrees lagging the second phase. The third phase may be 180 degrees lagging the first phase. The fourth receiver RX4 may receive a fourth data D[3] in a fourth phase (e.g., WCK270). The fourth phase may be 90 degrees lagging the third phase. The fourth phase may be 180 degrees lagging the second phase. The fourth phase may be 270 degrees lagging the first phase. For example, the first phase may be a 0 degree phase, the second phase may be a 90 degree phase, the third phase may be a 180 degree phase, and the fourth phase may be a 270 degree phase. First to fourth phases WCK0, WCK90, WCK180, and WCK270 may be controlled by the data clock WCK of the fourth signal line SL4. The first to fourth receivers RX1 to RX4 may receive the first to fourth data D[0:3] as input data through the first to fourth input terminals of the first to fourth receivers RX1 to RX4. The first to fourth receivers RX1 to RX4 may output the first to fourth data D[0:3] as output data through the first to fourth output terminals of the first to fourth receivers RX1 to RX4.

The first to fourth receivers RX1 to RX4 may receive the voltage level or current level of the first voltage V1 when the first switch SW1 connected to the second connection node N2 is turned on. The first to fourth receivers RX1 to RX4 may receive the voltage level or current level of the second voltage V2 when the second switch SW2 connected to the second connection node N2 is turned on. According to an embodiment, the first switch SW1 and the second switch SW2 sharing the second connection node N2 may be selectively turned on. In some examples, when the offset calibration circuit 220 is performed the offset calibration operation, the first switch SW1 may be turned on and the second switch SW2 may be turned off. In some examples, when the offset calibration circuit 220 is finished, the second switch SW2 may be turned on and the first switch SW1 may be turned off.

The first to fourth receivers RX1 to RX4 may receive a voltage level or current level of the ODT circuit 210 through the first connection node N1, and the voltage level or current level of the first voltage V1 or the second voltage V2 through the second connection node N2 as input data (e.g., D[0:3]). The first to fourth receivers RX1 to RX4 may output the received data D[0:3] and provide the output data D[0:3] to the offset calibration circuit 220. For example, the first to fourth receivers RX1 to RX4 may provide the output data D[0:3] to the offset calibration circuit 220 when the offset calibration circuit performs the offset calibration operation. In some examples, the first to fourth receivers RX1 to RX4 may provide the output data D[0:3] to a certain circuit (e.g., write driver) of the memory device 200 when the memory device 200 performs a write operation.

The offset calibration circuit 220 may receive the first to fourth data D[0:3] received from the first to fourth receivers RX1 to RX4. The offset calibration circuit 220 may perform offset calibration based on the received first to fourth data D[0:3]. The offset calibration may mean that the memory device 200 performs a training operation or corrects an error in the voltage level of the received first to fourth data D[0:3]. In addition, the offset calibration may mean correcting an error in a voltage level based on a result value stored in the memory device 200. The offset calibration circuit 220 may provide a result of performing the offset calibration to each of the first to fourth receivers RX1 to RX4. The offset calibration circuit 220 may perform offset calibration feedback by providing a result of performing the offset calibration to the first to fourth receivers RX1 to RX4. The offset calibration feedback may mean providing an error correction result value of a voltage level that is a result of performing the offset calibration. The error correction may be provided as a code having a logic value "0" or "1." For example, the code of the error correction may include a plurality of bits and each of the plurality of bits has a logic value "0" or "1." In example embodiments, when the first receiver RX1 receives the error correction code from the offset calibration circuit 220, a voltage level of the first data D[0] from the first receiver RX1 may be changed from "0" to "1" or from "1" to "0."

The ODT circuit 210 may include a plurality of ODT resistors (ODT1 to ODTm, m is a natural number). The configuration of the ODT circuit 210 is described below with reference to FIG. 2. One end of the ODT circuit 210 may be connected to the first connection node N1, and the other end thereof may be connected to a third voltage V3. The third voltage V3 may be the same as the first voltage V1. A voltage level of the third voltage V3 may be the same as the voltage level of the first voltage V1. Voltage levels of the first voltage V1 and the third voltage V3 may be lower than the voltage level of the second voltage V2.

In some embodiments, the memory system 10 may be an internal memory embedded in an electronic device. For example, the memory system 10 may be an SSD, an embedded UFS memory device, or an eMMC. In some embodiments, the memory system 10 may be an external memory detachable from the electronic device. For example, the memory system 10 may be a UFS memory card, a CF card, a secure digital (SD) card, a micro secure digital (Micro-SD) card, a mini secure digital (Mini-SD) card, an extreme digital (xD) card, or a memory stick.

In some embodiments, the memory controller 100 may be implemented to be included in a personal computer (PC) or a mobile electronic device. For example, the mobile electronic device may be implemented as a laptop computer, a mobile phone, a drone, a smartphone, a tablet PC, a personal digital assistant (PDA), an enterprise digital assistant (EDA), a digital still camera, a digital video camera, a portable multimedia player (PMP), a personal (or portable) navigation device (PND), a handheld game console, a mobile internet device (MID), a wearable computer, an internet of things (IoT) device, an internet of everything (IoE) device, or a drone.

The memory controller 100 may be implemented as an integrated circuit (IC), a system on a chip (SoC), an application processor (AP), a mobile AP, a chipset, or a set of chips. For example, the memory controller 100 may be a component included in the AP. The AP may include random access memory (RAM), a central processing unit (CPU), a graphics processing unit (GPU), and/or a modem.

In some embodiments, the memory device 200 may be implemented as a volatile memory device. The volatile memory device may be implemented as RAM, dynamic RAM (DRAM), or static RAM (SRAM), but is not limited thereto. For example, the memory device 200 may include double data rate synchronous dynamic random access memory (DDR SDRAM), low power double data rate (LPDDR) SDRAM, graphics double data rate (GDDR) SDRAM, rambus dynamic random access memory (RDRAM) and the like. Alternatively, the memory device 200 may be implemented as a high bandwidth memory (HBM).

Figure 2:
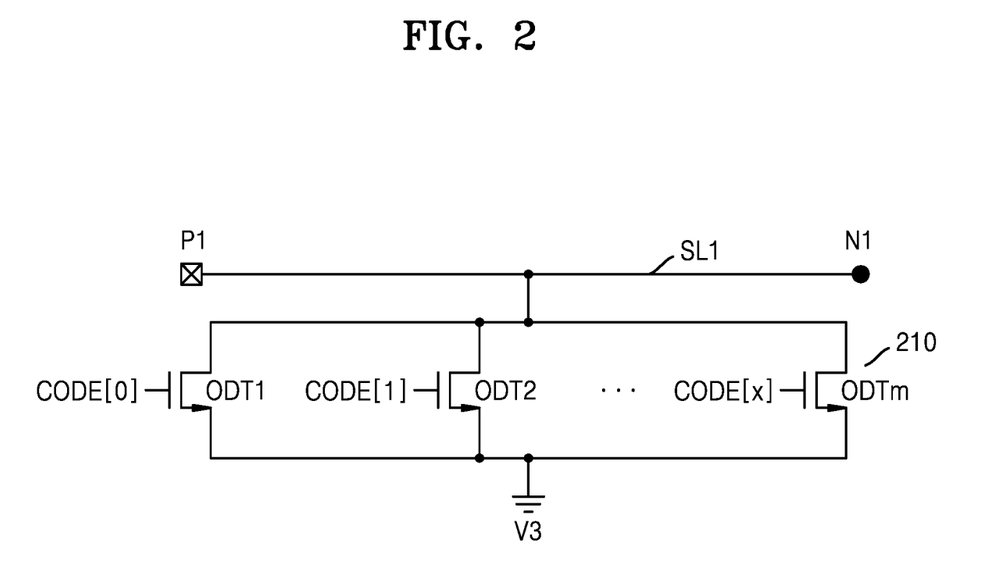
FIG. 2 is a circuit diagram illustrating an ODT circuit according to an embodiment.

FIG. 2 is a circuit diagram illustrating an ODT circuit according to an embodiment.

Referring to FIGS. 1 and 2 together, the ODT circuit 210 may include a plurality of ODT resistors (ODT1 to ODTm, m is a natural number). Although referred to herein as an ODT resistor, the resistor is not limited thereto and may be a transistor (e.g., an NMOS transistor). For example, each of the plurality of ODT resistors ODT1 to ODTm may include a transistor. The plurality of ODT resistors ODT1 to ODTm may be turned on/off based on a signal (e.g., code) and/or a command provided from the memory controller 100.

The plurality of ODT resistors ODT1 to ODTm, where m is a natural number, may include first to mth resistors ODT1 to ODTm. Each of the plurality of ODT resistors ODT1 to ODTm may be connected in parallel. For example, one end of the first ODT resistors ODT1 may be connected to the first signal line SL1 connected to the first pin P1, and the other end thereof may be connected to the third voltage V3. One end of the second ODT resistor ODT2 may be connected to the first signal line SL1 connected to the first pin P1, and the other end thereof may be connected to the third voltage V3. One end of the mth ODT resistor ODTm may be connected to the first signal line SL1 connected to the first pin P1, and the other end thereof may be connected to the third voltage V3.

The first to mth ODT resistors ODT1 to ODTm may be connected to the first signal line SL1, and may be turned on/off by a signal and/or a command provided from the memory controller 100. The memory controller 100 may generate the ODT resistance code CODE[0:x] and provide the generated ODT resistance code CODE[0:x] to the ODT circuit 210. The ODT resistance code CODE[0:x] may include a plurality of bits, and each of the plurality of bits may be input to a gate terminal of each of the first to mth ODT resistors ODT1 to ODTm to control turning-on or turning-off the first to mth ODT resistors ODT1 to ODTm. For example, only one ODT resistor among the first to mth ODT resistors ODT1 to ODTm may be turned on, or two or more ODT resistors may be turned on.

Figure 3:
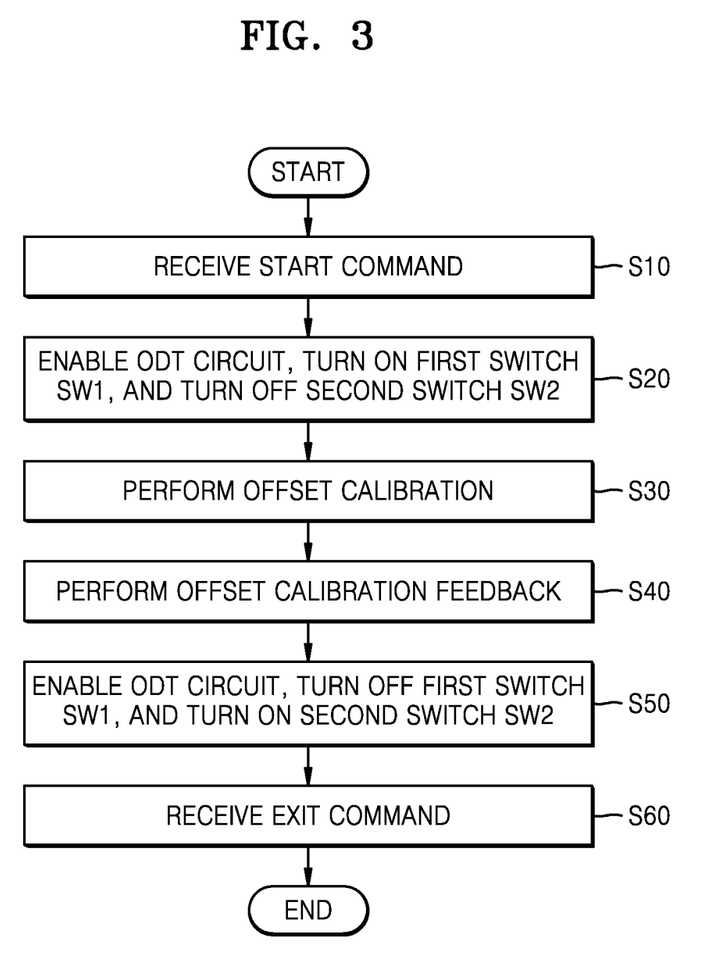
FIG. 3 is a flowchart illustrating an offset calibration operation method of a memory device according to an embodiment.

FIG. 3 is a flowchart illustrating an offset calibration operation method of a memory device according to an embodiment.

Referring to FIG. 3, in operation S10, the memory device 200 may receive a start command. For example, the memory controller 100 may transmit the start command to the memory device 200 through the third signal line SL3. The start command may include a mode register write start (hereinafter referred to as 'MRW_st') command and/or column address strobe (CAS). The memory device 200 may receive the start command from the memory controller 100 to provide data D[0:n−1] to the plurality of receivers RX1 to RXn. For example, first to fourth data D[0:3] may be respectively provided to the first to fourth receivers RX1 to RX4.

In operation S20, the memory device 200 may enable (or activate) the ODT circuit 210, turn on the first switch SW1, and turn off the second switch SW2. For example, the memory device 200 may enable the ODT circuit 210 connected to the first connection node N1 to be electrically connected to the third voltage V3. For example, a voltage level of the first connection node N1 may become the voltage level of the third voltage V3 when the ODT circuit 210 is enabled in response to a predetermined ODT resistance code CODE[0:x]. The memory device 200 may turn on the first switch SW1 connected to the second connection node N2 to provide a voltage level or a current level of the first voltage V1 to each of the first to fourth receivers RX1 to RX4, and may turn off the second switch SW2.

In operation S30, the offset calibration circuit 220 may perform an offset calibration. For example, the first to fourth receivers RX1 to RX4 may receive the voltage level of the first voltage V1, and the voltage level of the third voltage V3. The first to fourth receivers RX1 to RX4 may provide the received voltage levels as the first to fourth data D[0:3] to the offset calibration circuit 220.

In operation S40, the offset calibration circuit 220 may perform an offset calibration feedback operation. For example, the offset calibration circuit 220 may provide the results of performing the offset calibration to the first to fourth receivers RX1 to RX4. The results of performing the offset calibration may include at least a logic level of correction value for which the offset calibration is performed.

In operation S50, the memory device 200 may turn off the first switch SW1 and turn on the second switch SW2. For example, the memory device 200 may provide the voltage level of the second voltage V2 to each of the first to fourth receivers RX1 to RX4 by turning off the first switch SW1 and turning on the second switch SW2. In some examples, the memory device 200 may disable the ODT circuit 210 when the first switch SW1 is turned off and the second switch SW2 is turned on.

In operation S60, the memory device 200 may receive an exit command. The exit command may include a mode register write exit (hereinafter referred to as 'MRW_ex') command and/or CAS. For example, the memory controller 100 may transmit the exit command to the memory device 200 through the third signal line SL3. The memory device 200 may receive the exit command from the memory controller 100 and provide the received exit command to the first to fourth receivers RX1 to RX4 or the offset calibration circuit 220. The memory device 200 may exit the offset calibration operation and/or the offset calibration feedback operation by receiving the exit command.

Figure 4:
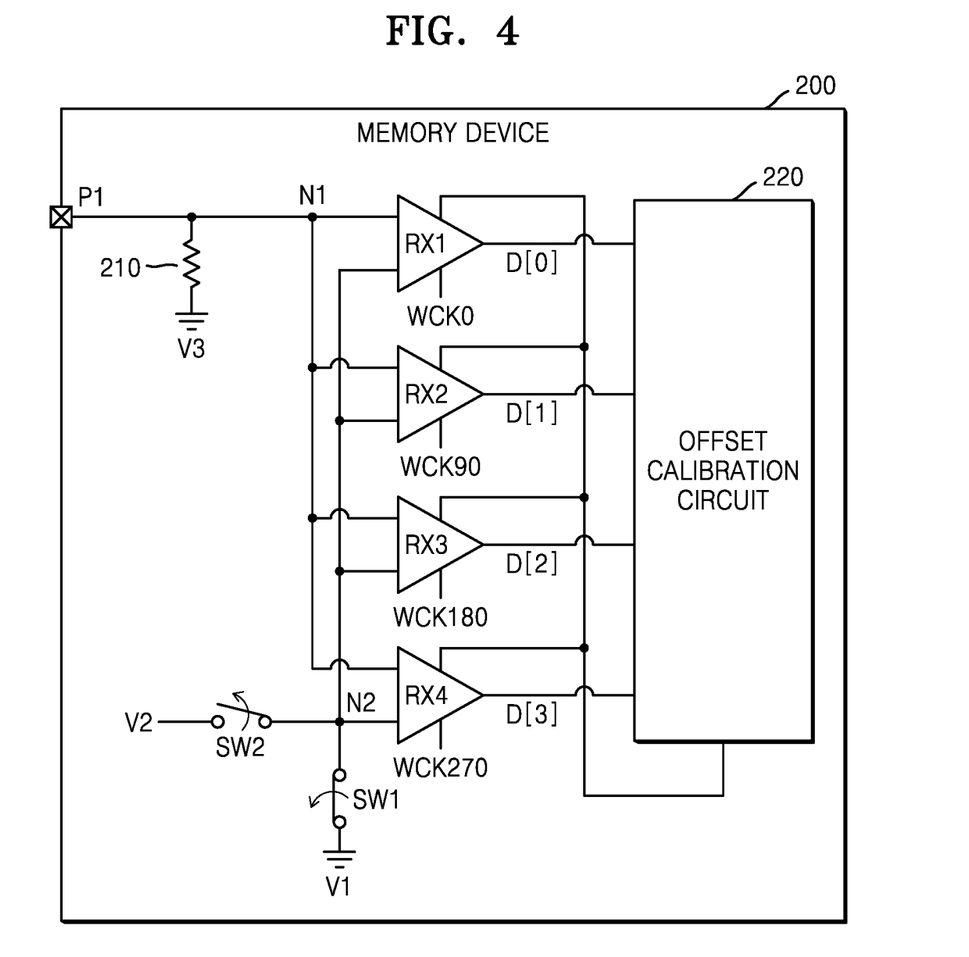
FIG. 4 is a circuit diagram illustrating an offset calibration operation method of a memory device according to an embodiment.

FIG. 4 is a circuit diagram illustrating an offset calibration operation method of a memory device according to an embodiment. FIG. 4 will be described on the assumption that the first to fourth receivers RX1 to RX4 each receive 1-bit data.

Although not shown in FIG. 4, after the memory controller 100 provides data DQ to the memory device 200, the memory controller 100 may be switched to a floating state. The floating state may refer to a state in which the memory controller 100 no longer provides signals and commands to the memory device 200.

Referring to FIG. 4, when the ODT circuit 210 is enabled, the third voltage V3 may be electrically connected to the first connection node N1. One end of the ODT circuit 210 may be connected to the first connection node N1, and the other end thereof may be connected to the third voltage V3. Each of the first to fourth receivers RX1 to RX4 may receive the voltage level of the third voltage V3.

The first switch SW1 connected to the second connection node N2 may be turned on, and the second switch SW2 may be turned off. As the first switch SW1 is turned on, each of the first to fourth receivers RX1 to RX4 may receive the voltage level of the first voltage V1.

The first receiver RX1 may receive voltage levels of the first and third voltages V1 and V3 as a first data D[0] in the first phase. The second receiver RX2 may receive voltage levels of the first and third voltages V1 and V3 as a second data D[1] in the second phase. The second phase may be a phase that is 90 degrees lagging the first phase. The third receiver RX3 may receive voltage levels of the first and third voltages V1 and V3 as a third data D[2] in the third phase. The third phase may be 90 degrees lagging the second phase, and 180 degrees lagging the first phase. The fourth receiver RX4 may receive voltage levels of the first and third voltages V1 and V3 as a fourth data D[3] in the fourth phase. The fourth phase may be 90 degrees lagging the third phase, the fourth phase may be 180 degrees lagging the second phase, and the fourth phase may be 270 degrees lagging the first phase. For example, the first phase may be 0 degrees, the second phase may be 90 degrees, the third phase may be 180 degrees, and the fourth phase may be 270 degrees. The first to fourth receivers RX1 to RX4 may provide the first to fourth data D[0:3] to the offset calibration circuit 220.

Figure 5:
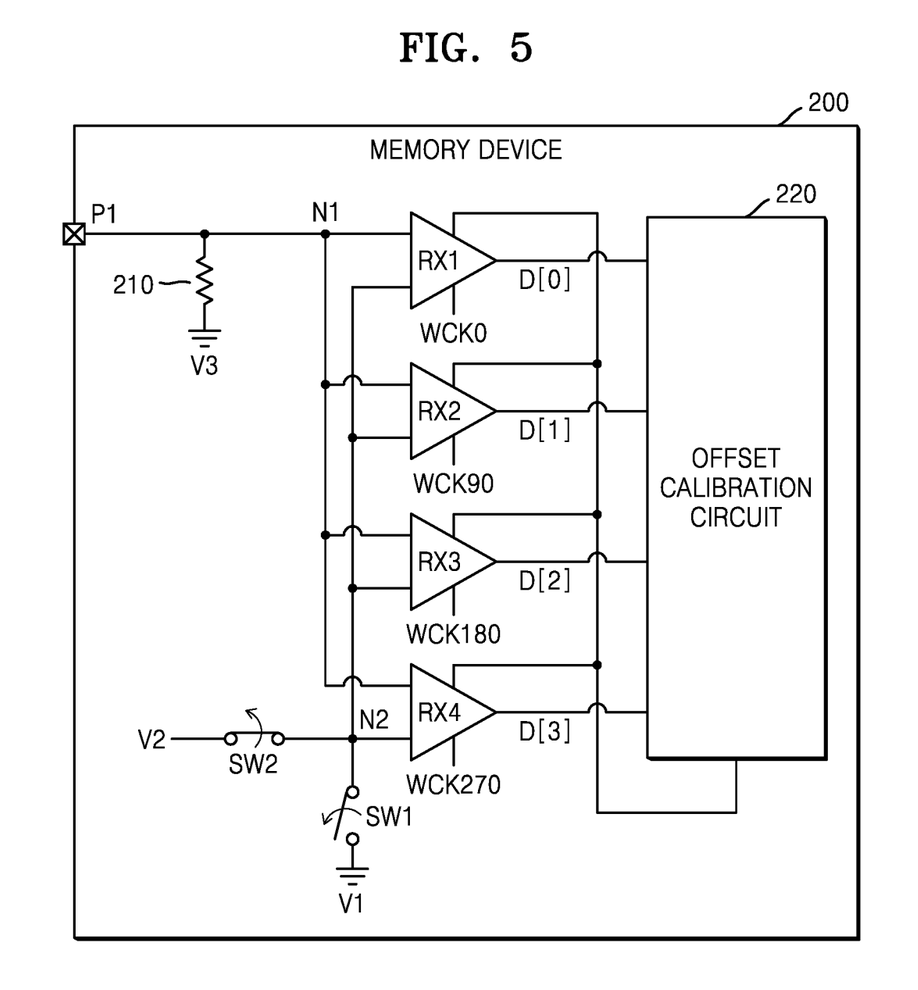
FIG. 5 is a circuit diagram illustrating an offset calibration feedback operation method of a memory device according to an embodiment.

FIG. 5 is a circuit diagram illustrating an offset calibration feedback operation method of a memory device according to an embodiment.

Referring to FIG. 5, when the ODT circuit 210 is enabled, the third voltage V3 may be electrically connected to the first connection node N1. One end of the ODT circuit 210 may be connected to the first connection node N1, and the other end thereof may be connected to the third voltage V3. The ODT circuit 210 may always maintain an enabled state as shown in FIG. 4. Each of the first to fourth receivers RX1 to RX4 may receive the voltage level of the third voltage V3.

In contrast, the first switch SW1 connected to the second connection node N2 may be turned off and the second switch SW2 may be turned on when the offset calibration operation is finished. As the second switch SW2 is turned on, each of the first to fourth receivers RX1 to RX4 may receive the voltage level of the second voltage V2.

The offset calibration circuit 220 may provide a result of performing the offset calibration (e.g., a logic level of correction value) to the first to fourth receivers RX1 to RX4. The offset calibration circuit 220 may perform the offset calibration feedback operation based on the result of performing the offset calibration operation.

For example, the first receiver RX1 may receive the voltage levels of the first voltage V1 and the third voltage V3, and an offset correction as a result of the feedback of the offset calibration circuit 220 in a first phase (e.g., WCK0). The second receiver RX2 may receive the voltage levels of the first voltage V1 and the third voltage V3, and an offset correction as a result of the feedback of the offset calibration circuit 220 in a second phase (e.g., WCK90). The second phase may be 90 degrees lagging the first phase. The third receiver RX3 may receive the voltage level of the first voltage V1 and the third voltage V3, and an offset correction as a result of the feedback of the offset calibration circuit 220 in a third phase (e.g., WCK180). The third phase may be 90 degrees lagging the second phase. The fourth receiver RX4 may receive the voltage level of the first voltage V1 and the third voltage V3, and an offset correction as a result of the feedback of the offset calibration circuit 220 in a fourth phase (e.g., WCK270). The fourth phase may be 90 degrees lagging the third phase. In example embodiments, the offset calibration circuit 220 may be sequentially or simultaneously performed the offset calibration operation for the plurality of receivers RX1 to RX4.

Referring to FIGS. 1 and 2, the time period required for the offset calibration circuit 220 to perform the offset calibration operation and the offset calibration feedback operation may be up to 3 μs (micro seconds).

Figure 6:
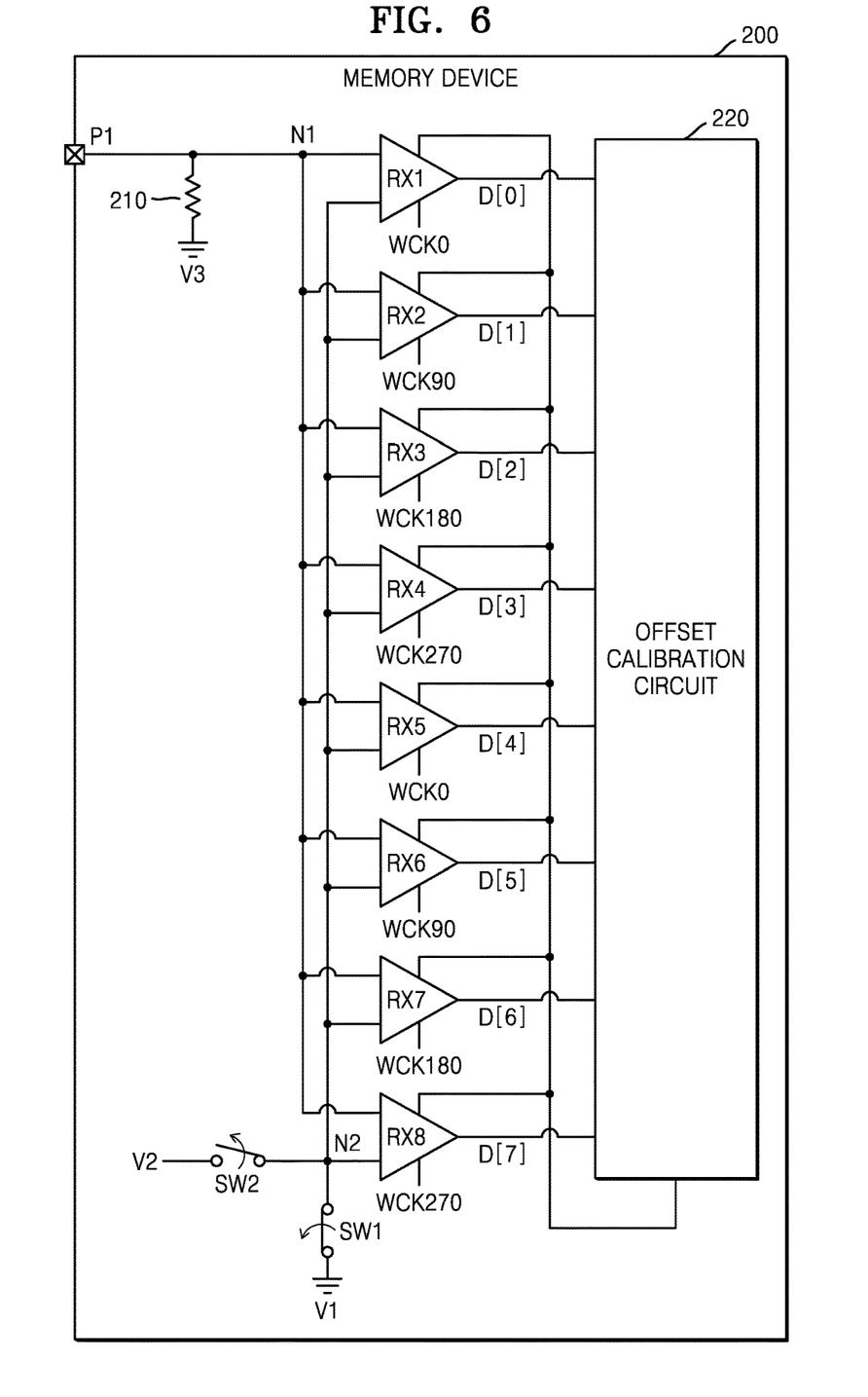
FIG. 6 is a circuit diagram illustrating an offset calibration operation method of a memory device according to another embodiment.

FIG. 6 is a circuit diagram illustrating an offset calibration operation method of a memory device according to another embodiment. FIG. 6 will be described on the assumption that first to eighth receivers RX1 to RX8 each receive 1 bit of data. The description already given with reference to FIG. 4 is omitted and FIG. 6 is described.

Although not shown in FIG. 6, after the memory controller 100 provides the data DQ to the memory device 200, the memory controller 100 may be switched to the floating state.

Referring to FIG. 6, when the ODT circuit 210 is enabled, the third voltage V3 may be electrically connected to the first connection node N1. One end of the ODT circuit 210 may be connected to the first connection node N1, and the other end thereof may be connected to the third voltage V3. Each of the first to eighth receivers RX1 to RX8 may receive the voltage level of the third voltage V3.

The first switch SW1 connected to the second connection node N2 may be turned on, and the second switch SW2 may be turned off. As the first switch SW1 is turned on, each of the first to eighth receivers RX1 to RX8 may receive the voltage level of the first voltage V1.

The first receiver RX1 may receive voltage levels of the first and third voltages V1 and V3 as a first data D[0] in the first phase. The second receiver RX2 may receive voltage levels of the first and third voltages V1 and V3 as a second data D[1] in the second phase. The third receiver RX3 may receive a third data D[2] in the third phase. The fourth receiver RX4 may receive voltage levels of the first and third voltages V1 and V3 as a fourth data D[3] in the fourth phase. The fifth receiver RX5 may receive voltage levels of the first and third voltages V1 and V3 as a fifth data D[4] in the first phase. The sixth receiver RX6 may receive voltage levels of the first and third voltages V1 and V3 as a sixth data D[5] in the second phase. The seventh receiver RX7 may receive voltage levels of the first and third voltages V1 and V3 as a seventh data D[6] in the third phase. The eighth receiver RX8 may receive voltage levels of the first and third voltages V1 and V3 as an eighth data D[7] in the fourth phase. The first to eighth receivers RX1 to RX8 may provide the first to eighth data D[0:7] to the offset calibration circuit 220.

Figure 7:
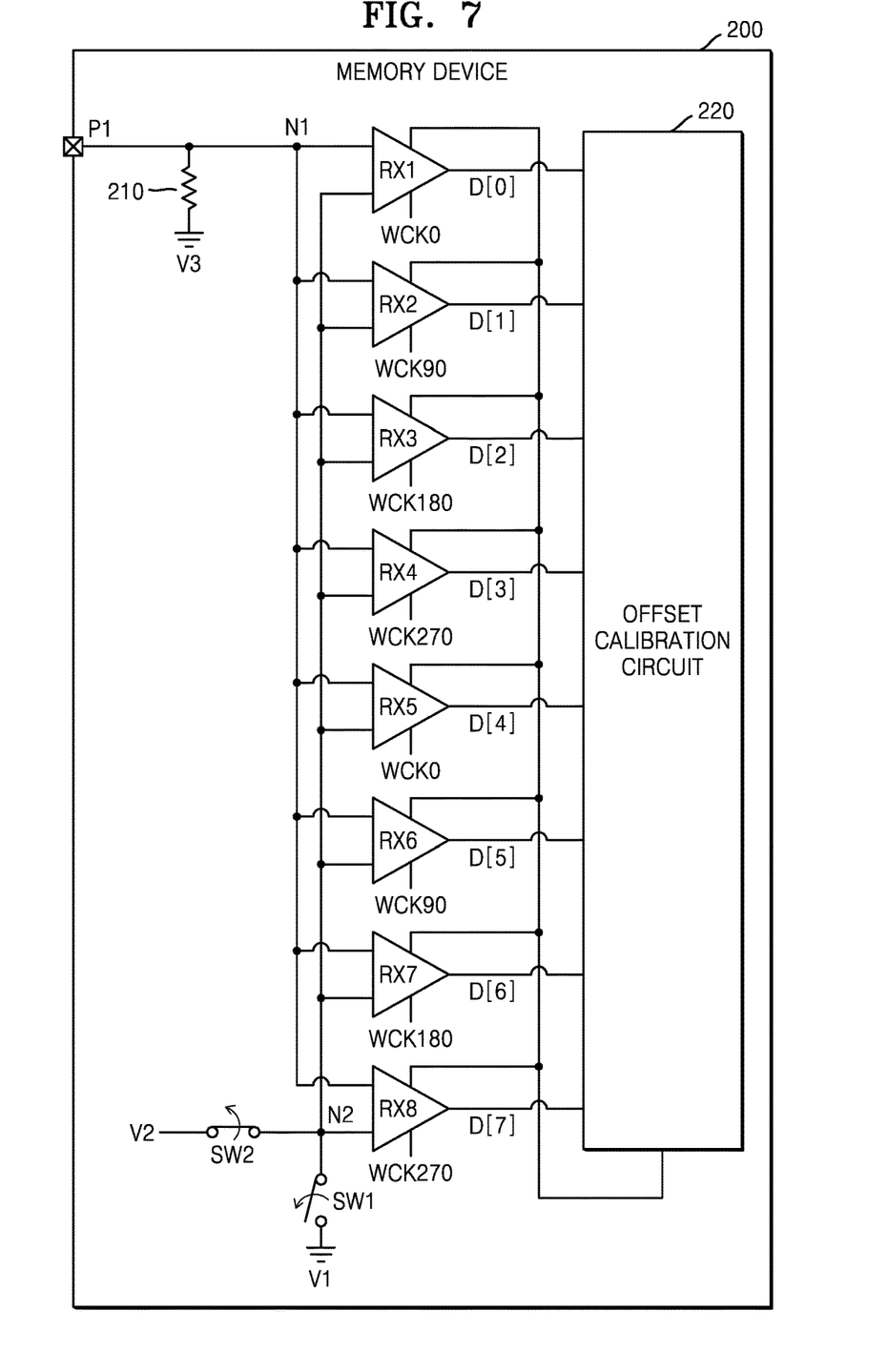
FIG. 7 is a circuit diagram illustrating an offset calibration feedback operation method of a memory device according to another embodiment.

FIG. 7 is a circuit diagram illustrating an offset calibration feedback operation method of a memory device according to another embodiment. The description already given with reference to FIG. 5 is omitted and FIG. 7 is described.

Referring to FIG. 7, when the ODT circuit 210 is enabled, the third voltage V3 may be electrically connected to the first connection node N1. One end of the ODT circuit 210 may be connected to the first connection node N1, and the other end thereof may be connected to the third voltage V3. The ODT circuit 210 may always maintain an enabled state as shown in FIG. 6. Each of the first to eighth receivers RX1 to RX8 may receive the voltage level of the third voltage V3.

In contrast, the first switch SW1 may be turned off and the second switch SW2 may be turned on when the offset calibration circuit 220 is finished the offset calibration operation. As the second switch SW2 is turned on, each of the first to eighth receivers RX1 to RX8 may receive a voltage level of the second voltage V2.

The offset calibration circuit 220 may provide a result of performing the offset calibration (e.g., a logic level of correction value) to the first to eighth receivers RX1 to RX8. The offset calibration circuit 220 may perform offset calibration feedback operation based on the result of performing the offset calibration operation.

For example, the first receiver RX1 and the fifth receiver RX5 may receive the voltage levels of the first voltage V1 and the third voltage V3 and an error correction as a result of the feedback of the offset calibration circuit 220 in the first phase. The second receiver RX2 and the sixth receiver RX6 may receive the voltage levels of the first voltage V1 and the third voltage V3 and an error correction as a result of the feedback of the offset calibration circuit 220 in the second phase. The third receiver RX3 and the seventh receiver RX7 may receive the voltage levels of the first voltage V1 and the third voltage V3 and an error correction as a result of the feedback of the offset calibration circuit 220 in the third phase. The fourth receiver RX4 and the eighth receiver RX8 may receive the voltage levels of the first voltage V1 and the third voltage V3 and an error correction as a result of the feedback of the offset calibration circuit 220 in the fourth phase.

Referring to FIGS. 6 and 7, the time required for the offset calibration circuit 220 to perform the offset calibration and the offset calibration feedback may be up to 3 μs (micro seconds).

Figure 8:
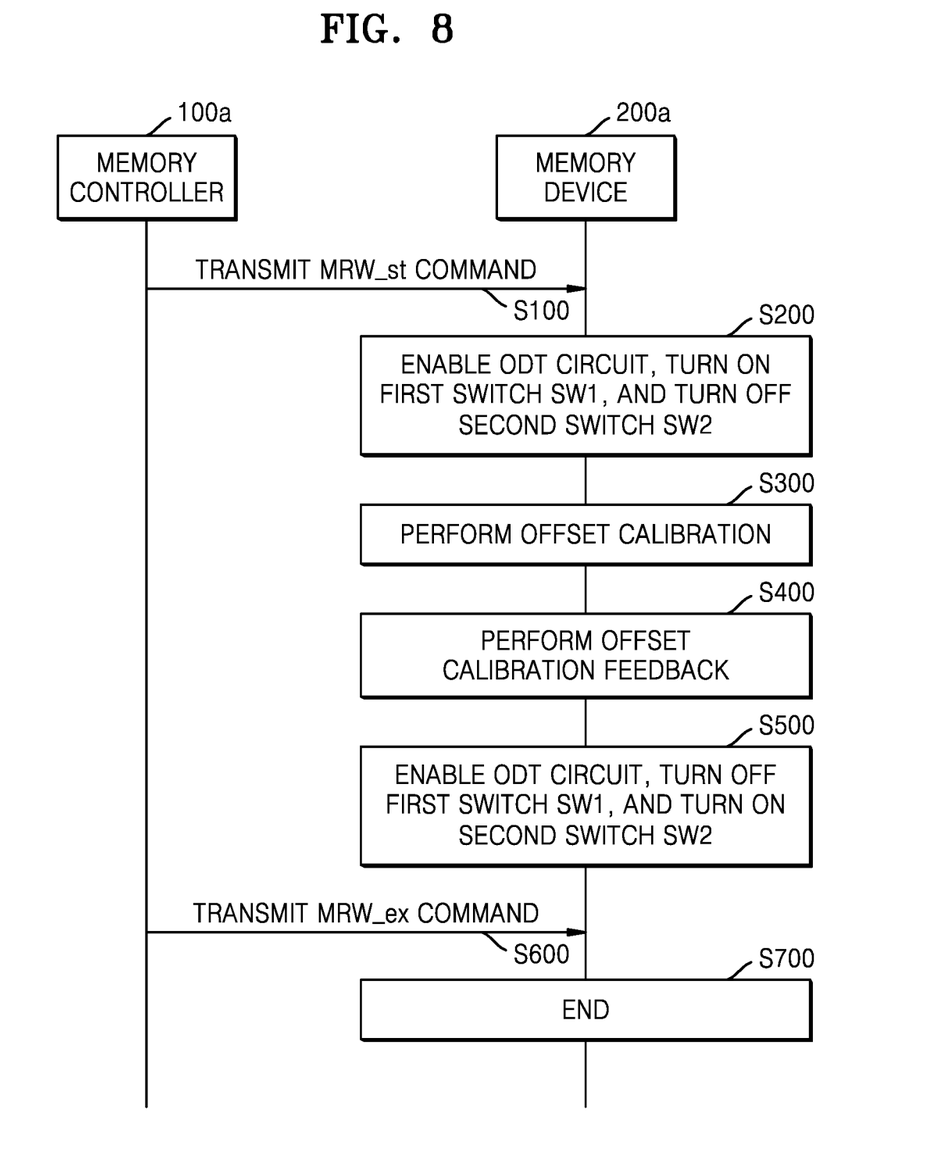
FIG. 8 is a diagram illustrating examples of operations between a memory controller and a memory device over time according to an embodiment.

FIG. 8 is a diagram illustrating examples of operations between a memory controller and a memory device over time according to an embodiment.

Referring to FIG. 8, a memory controller 100a and a memory device 200a may correspond to the memory controller 100 and the memory device 200 shown in FIG. 1, respectively.

In operation S100, the memory controller 100a may transmit an MRW_st command. The memory controller 100a may transmit the MRW_st command to the memory device 200a through the third signal line SL3. Also, when the memory controller 100a provides the MRW_st command to the memory device 200a, the memory controller 100a may be switched to the floating state.

In operation S200, the memory device 200a may enable the ODT circuit 210, turn on the first switch SW1, and turn off the second switch SW2, in response to the received MRW_st command. The ODT circuit 210 may be enabled and connected to the first connection node N1. The ODT circuit 210 may be connected to the third voltage V3. The first switch SW1 may be turned on and connected to the second connection node N2 to provide a voltage level of the first voltage V1. The second switch SW2 may be turned off and not connected to the second connection node N2. As the second switch SW2 is turned off, the voltage level of the second voltage V2 may not be provided. Each of the first to fourth receivers RX1 to RX4 may receive the voltage level of the third voltage V3 through the first connection node N1 and the voltage level of the first voltage V1 through the second connection node N2.

In operation S300, the memory device 200a may perform an offset calibration operation. The offset calibration circuit 220 may receive the first to fourth data D[0:3] from the first to fourth receivers RX1 to RX4 and perform the offset calibration.

In operation S400, the memory device 200a may perform an offset calibration feedback operation. The offset calibration circuit 220 may provide the results of performing the offset calibration to the first to fourth receivers RX1 to RX4. The offset calibration circuit 220 may perform the offset calibration feedback operation. For example, the first receiver RX1 may receive the voltage levels of the first voltage V1 and the third voltage V3 and an error correction as a result of the feedback of the offset calibration circuit 220 in a first phase. The second receiver RX2 may receive the voltage levels of the first voltage V1 and the third voltage V3 and the error correction as a result of the feedback of the offset calibration circuit 220 in a second phase. The third receiver RX3 may receive the voltage levels of the first voltage V1 and the third voltage V3 and the error correction as a result of the feedback of the offset calibration circuit 220 in a third phase. The fourth receiver RX4 may receive the voltage levels of the first voltage V1 and the third voltage V3 and the error correction as a result of the feedback of the offset calibration circuit 220 in a fourth phase.

In operation S500, the second switch SW2 connected to the second connection node N2 may be turned on to receive the second voltage V2. The first switch SW1 may be turned off such that the voltage level of the first voltage V1 may not provide to the second connection node N2. Each of the first to fourth receivers RX1 to RX4 may receive the voltage level of the second voltage V2 through the second switch SW2. In some examples, memory device 200a may disable the ODT circuit 210 when the first switch SW1 is turned off and the second switch SW2 is turned on.

In operation S600, the memory controller 100a may transmit an MRW_ex command. The memory controller 100a may transmit the MRW_ex command to the memory device 200a through the third signal line SL3.

The time taken from operation S100 to operation S600 may be a preset time. The preset time may be up to a maximum of 3 μs (micro seconds).

In operation S700, the memory device 200a may end the offset calibration operation in response to the MRW_ex command. In this case, the memory device 200a may end without performing the offset calibration and offset calibration feedback operations any longer.

Figure 9:
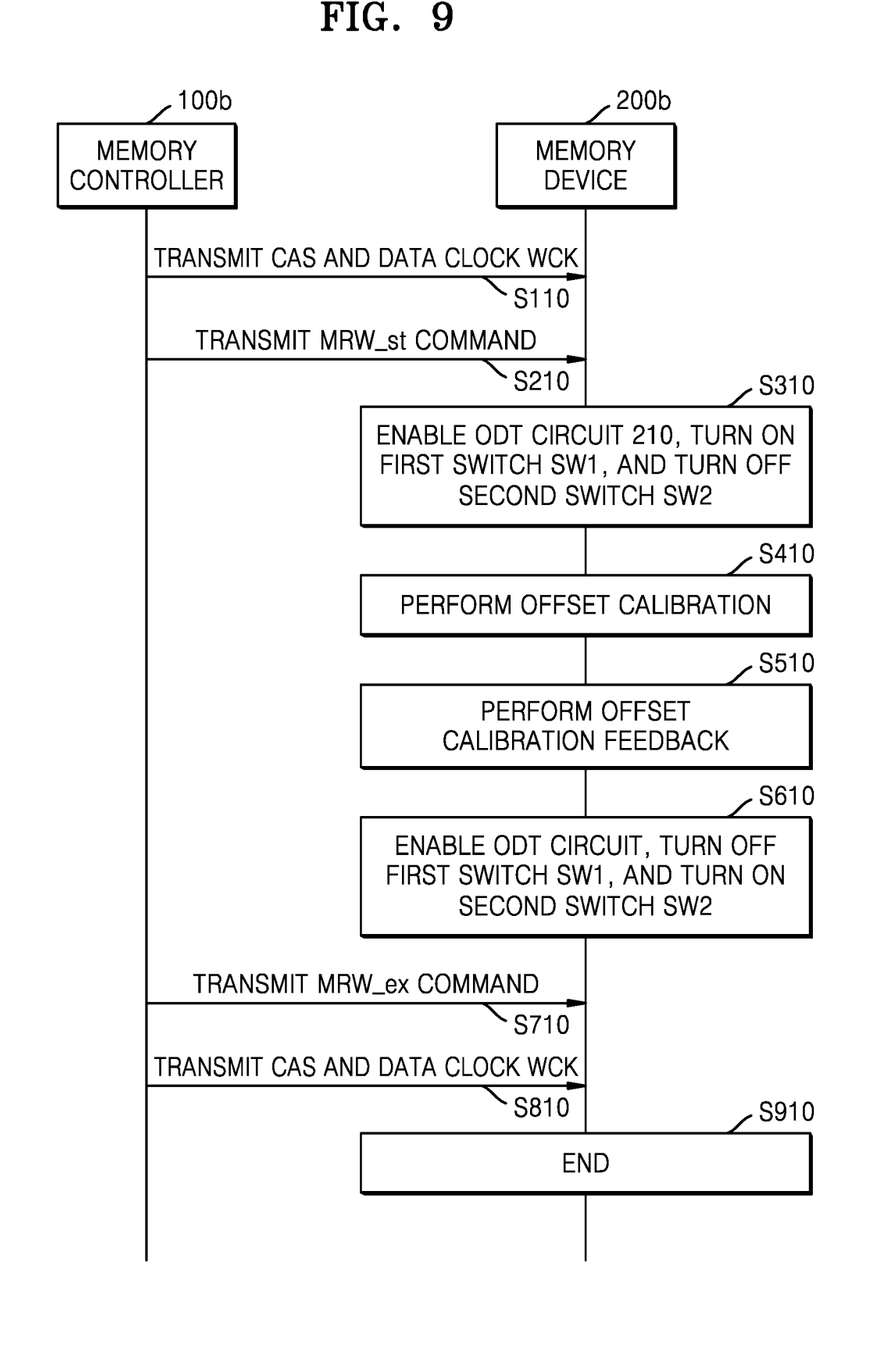
FIG. 9 is a diagram illustrating examples of operations between a memory controller and a memory device over time according to another embodiment.

FIG. 9 is a diagram illustrating examples of operations between a memory controller and a memory device over time according to another embodiment. The description already given with reference to FIG. 8 is omitted and FIG. 9 is described.

Referring to FIG. 9, a memory controller 100b and a memory device 200b may respectively correspond to the memory controller 100 and the memory device 200 illustrated in FIG. 1.

In operation S110, the memory controller 100b may transmit a CAS and a data clock WCK to the memory device 200b.

In operation S210, the memory controller 100b may transmit an MRW_st command. The memory controller 100b may transmit the MRW_st command to the memory device 200b through the third signal line SL3. Also, after the memory controller 100b provides the MRW_st command to the memory device 200b, the memory controller 100b may be switched to the floating state. In this case, the floating state may refer to a state in which the memory controller 100b no longer provides the CAS, the data clock WCK, and the MRW_st command to the memory device 200b.

In operation S310, the memory device 200b may enable the ODT circuit 210, turn on the first switch SW1, and turn off the second switch SW2, in response to the received MRW_st command. The ODT circuit 210 may be enabled and connected to the first connection node N1. The first connection node N1 may be electrically connected to the third voltage V3 when the ODT circuit 210 is enabled. The first switch SW1 may be turned on and connected to the second connection node N2 to provide the voltage level of the first voltage V1. The second switch SW2 may be turned off and not connected to the second connection node N2. As the second switch SW2 is turned off, the voltage level of the second voltage V2 may not be provided. For example, each of the first to fourth receivers RX1 to RX4 may receive the voltage level of the third voltage V3 through the first connection node N1 and the voltage level of the first voltage V1 through the second connection node N2.

In operation S410, the memory device 200b may perform an offset calibration. The offset calibration circuit 220 may receive the first to fourth data D[0:3] from the first to fourth receivers RX1 to RX4 and perform the offset calibration.

In operation S510, the memory device 200b may perform an offset calibration feedback operation. The offset calibration circuit 220 may provide the results of performing the offset calibration operation to the first to fourth receivers RX1 to RX4. The offset calibration circuit 220 may perform the offset calibration feedback operation.

In operation S610, the memory device 200b may turn off the first switch SW1 and turn on the second switch SW2. For example, the memory device 200b may provide a voltage level or a current level of the second voltage V2 to each of the first to fourth receivers RX1 to RX4 by turning off the first switch SW1 and turning on the second switch SW2. In some examples, the memory device 200b may disable the ODT circuit 210 when the first switch SW1 is turned off and the second switch SW2 is turned on.

In operation S710, the memory controller 100b may transmit an MRW_ex command. The memory controller 100b may transmit the MRW_ex command to the memory device 200b through the third signal line SL3.

In operation S810, the memory controller 100b may transmit the CAS and the data clock WCK to the memory device 200b.

The time taken from operation S210 to operation S710 may be a preset time. The preset time may be up to a maximum of 3 μs (micro seconds).

In operation S910, the memory device 200b may end the offset calibration operation in response to the MRW_ex command. In this case, the memory device 200b may end without performing the offset calibration and offset calibration feedback operations any longer.

Figure 10:
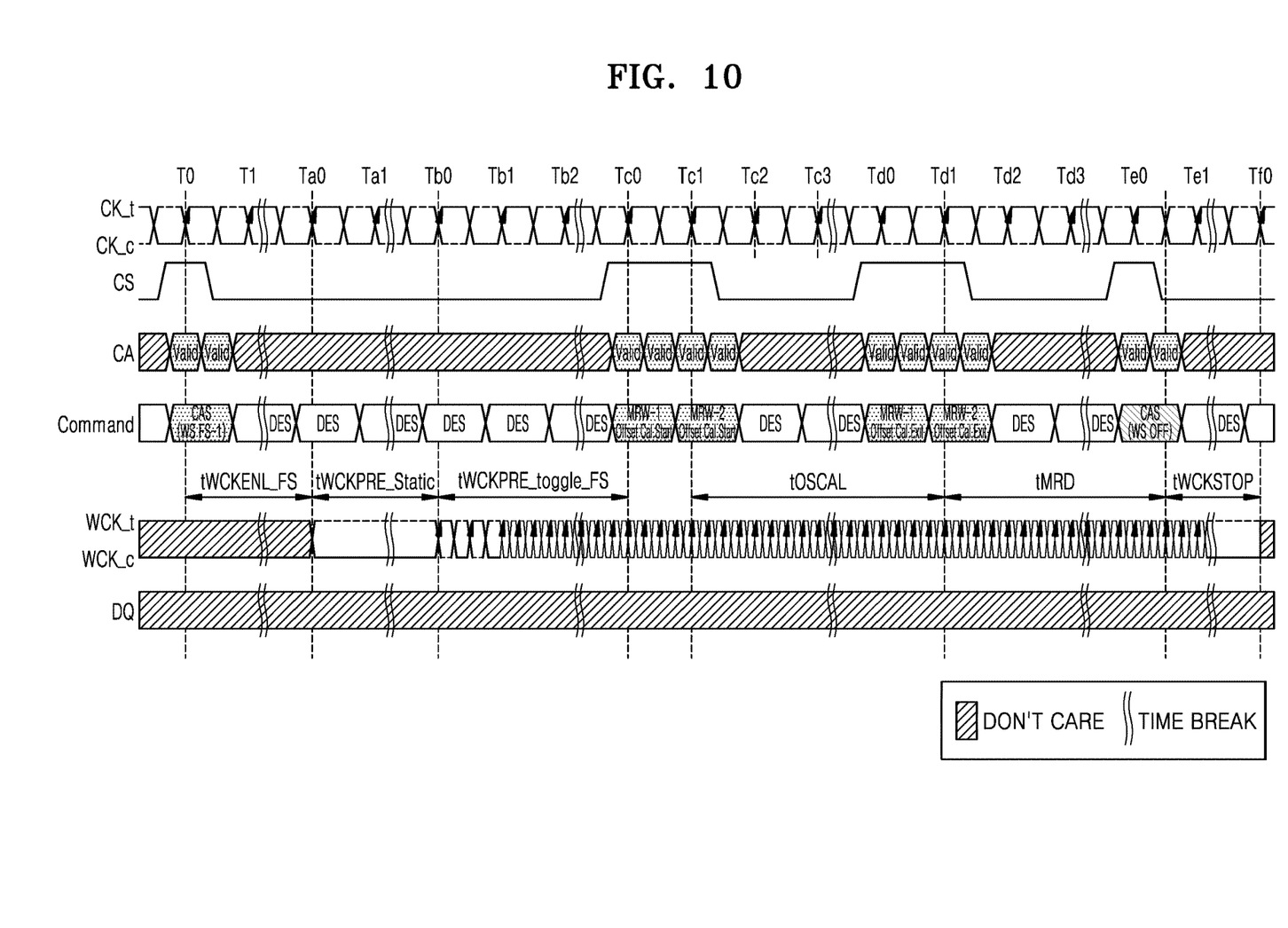
FIG. 10 is a timing diagram of signals moving between a memory device and a memory controller during an offset calibration operation according to an embodiment.

FIG. 10 is a timing diagram of signals transmitting between a memory device and a memory controller during an offset calibration operation according to an embodiment.

Referring to FIGS. 1 and 10, as the memory controller 100 transmits the command CMD to the memory device 200, the offset calibration operation may be started. Here, the command may include a CAS and/or an MRW_st command, an MRW_ex command, and the like.

The memory controller 100 may provide clock signals CK_t and CK_c and data clocks WCK_t and WCK_c to the memory device 200. The clock signals CK_t and CK_c may be complementary, and the data clocks WCK_t and WCK_c may be complementary. In addition, the data clocks WCK_t and WCK_c may have a greater clock frequency than the clock signals CK_t and CK_c. For example, the data clocks WCK_t and WCK_c may have a clock frequency that is four times the clock frequency of the clock signals CK_t and CK_c. Hereinafter, for convenience of description, clock signals CK_t and CK_c may be referred to as a clock signal CK, and data clocks WCK_t and WCK_c may be referred to as a data clock WCK. When the memory controller 100 provides a command and a related address to the memory device 200, the memory device 200 may receive the command and the related address. The memory device 200 may perform a mode register write (MRW) operation. For example, when the MRW_st command is provided to the memory device 200 by the memory controller 100, the memory device 200 may perform an MRW start operation. The MRW_st command may be provided before Tc0. For example, when the MRW_ex command is provided from the memory controller 100 to the memory device 200, the memory device 200 may perform an MRW end operation. The MRW_ex command may be provided before Td0.

As the MRW_st command is provided to the memory device 200, the offset calibration circuit 220 may perform an offset calibration operation and/or an offset calibration feedback operation. The offset calibration operation and the offset calibration feedback operation may be performed when the second connection node N2 is electrically connected to the first voltage V1 through the first switch SW1.

A time tWCKENL_FS may mean a time period required for the memory device 200 to be enabled after the data clock WCK is provided to the memory device 200 by the memory controller 100. The time tWCKENL_FS may mean a time period between times T0 and Ta0. A time tWCKPRE_Static may mean a time period between times Ta0 and Tb0. A time tWCKPRE_toggle_FS may mean a time period required for the memory device 200 to be toggled. The time tWCKPRE_toggle_FS may mean a time period between times Tb0 and Tc0. A time tMRD may mean a time period between times Td1 and Te1. A time tWCKSTOP may mean a time period during which the memory controller 100 no longer provides the data clock WCK to the memory device 200. The time tWCKSTOP may mean a time period between times Te1 and Tf0.

A time tOSCAL may be a time period required to perform offset calibration operation and offset calibration feedback operation. The time tOSCAL may mean a time period between times Tc1 and Td1. For example, the time tOSCAL may be up to 3 μs (micro seconds).

For example, according to the technical idea of the inventive concept, it is possible to ensure signal integrity and improve the quality of a data signal by driving the training of the offset calibration circuit.

In addition, according to the technical idea of the inventive concept, because training operations of the offset calibration circuit may be performed by selecting a voltage, it is possible to reduce a training time and improve the efficiency of reception interface.

While the inventive concept has been particularly shown and described with reference to embodiments thereof, it will be understood that various changes in form and details may be made therein without departing from the spirit and scope of the following claims.

What is claimed is:

1. A memory device comprising:
   an input/output pad configured to receive data from a device external;
   an on-die termination (ODT) circuit connected to the input/output pad;
   a plurality of receivers each including:
   a first input terminal connected to the ODT circuit and configured to receive the data from the input/output pad as a first input data,
   a second input terminal configured to receive a second input data, and
   an output terminal configured to output data based on the first and second input data;
   an offset calibration circuit configured to perform an offset calibration operation on the data output from the plurality of receivers and output an offset correction as a result of the offset calibration operation to the plurality of receivers;
   a first switch configured to provide a first voltage to the second input terminals of the plurality of receivers as the second input data in response to the first switch being turned on; and a second switch configured to provide a second voltage different from the first voltage to the second input terminals as the second input data in response to the second switch being turned on, wherein the plurality of receivers are configured to, during the offset calibration operation:

receive a third voltage different from the second voltage through the first input terminals of the plurality of receivers in response to the ODT circuit being enabled, receive the first voltage through the second input terminals in response to the first switch being turned on and the second switch being turned off, and receive the offset correction as the result of the offset calibration operation from the ODT circuit.

2. The memory device of claim 1, wherein the ODT circuit comprises a first ODT resistor, a second ODT resistor, and a third ODT resistor, and wherein the first ODT resistor, the second ODT resistor, and the third ODT resistor are connected in parallel.

3. The memory device of claim 1, wherein:

the plurality of receivers comprise a first receiver, a second receiver, a third receiver, and a fourth receiver, the first receiver is configured to receive a first data in a first phase, the second receiver is configured to receive a second data in a second phase, the third receiver is configured to receive a third data in a third phase, the fourth receiver is configured to receive a fourth data in a fourth phase, and the second phase lags the first phase, the third phase lags the second phase, and the fourth phase lags the third phase.

4. The memory device of claim 3, wherein the second input terminals of the plurality of receivers are configured to receive the second voltage when the first switch is turned off and the second switch is turned on.

5. The memory device of claim 4, wherein the offset calibration circuit is configured to output the offset correction to each of the first receiver, the second receiver, the third receiver, and the fourth receiver.

6. The memory device of claim 3, wherein the memory device is configured such that when the first switch is turned on and the second switch is turned off, the first receiver transmits the received first data to the offset calibration circuit and the offset calibration circuit transmits the offset correction to the first receiver.

7. The memory device of claim 6, wherein the memory device is configured such that when the first switch is turned off and the second switch is turned on, the first receiver receives the second voltage through the second switch.

8. The memory device of claim 1, wherein a voltage level of the first voltage is less than a voltage level of the second voltage.

9. The memory device of claim 1, wherein a voltage level of the first voltage is the same as a voltage level of the third voltage.

10. The memory device of claim 1, wherein the offset calibration circuit is configured to, in response to a mode register write command from the device external, perform the offset calibration operation and output the offset correction to the plurality of receivers.

11. A method of operating a memory device including a plurality of receivers each having a first input terminal connected to an on-die termination (ODT) circuit, a second input terminal, and an output terminal connected to an offset calibration circuit, the method comprising:

enabling the ODT circuit to provide a third voltage to the first input terminals of the plurality of receivers in response to a mode register write start command from a device external;

turning off a second switch and turning on a first switch to provide a first voltage to the second input terminals of the plurality of receivers;

outputting data from the output terminals of the plurality of receivers to the offset calibration circuit in response to voltage levels of the first and third voltages;

performing an offset calibration operation on the data output from the plurality of receivers by the offset calibration circuit;

feeding back a result of performing the offset calibration operation to the plurality of receivers; and turning off the first switch and turning on the second switch to provide a second voltage different from the first voltage to the second input terminals.

12. The method of claim 11, wherein the performing of the offset calibration operation includes receiving the first voltage and the third voltage by the plurality of receivers in different phases from each other.

13. The method of claim 11, wherein a voltage level of the first voltage is equal to a voltage level of the third voltage.

14. The method of claim 11, wherein a voltage level of the first voltage is less than a voltage level of the second voltage.

15. The method of claim 11, further comprising:

disabling the ODT circuit when the turning on of the second switch is performed.

16. The method of claim 11, further comprising:

after the feeding back of the result of performing the offset calibration operation, receiving a mode register write exit command from the device external.

17. A method of operating a memory device including a plurality of receivers, the method comprising:

enabling an on-die termination (ODT) circuit connected to first input terminals of the plurality of receivers to provide a third voltage to the first input terminals in response to a mode register write start command from a device external;

turning off a second switch and turning on a first switch to provide a first voltage the same as the third voltage to second input terminals of the plurality of receivers;

outputting a data from output terminals of the plurality of receivers in response to voltage levels of the first and third voltages;

performing an offset calibration operation on the data received from the plurality of receiver;

feeding back a result of performing the offset calibration operation; and turning off the first switch and turning on a second switch to provide a second voltage different from the first voltage to the second input terminals.

18. The method of claim 17, wherein the performing of the offset calibration operation includes sequentially receiving the voltage levels of the first voltage and the third voltage in different phases from each other by the plurality of receivers.

19. The method of claim 17, wherein the feeding back of the result of performing the offset calibration operation includes feeding back the result of the offset calibration operation to the plurality of receivers in different phases from each other.

20. The method of claim 17, wherein the performing of the offset calibration operation is performed only for a predetermined time period.

* * * * *